United States Patent
Fang et al.

(10) Patent No.: US 6,782,026 B2
(45) Date of Patent: Aug. 24, 2004

(54) SEMICONDUCTOR LASER STRUCTURE AND METHOD OF MANUFACTURING SAME

(75) Inventors: Ruiyu Fang, Turin (IT); Roberto Paoletti, Turin (IT)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/206,833

(22) Filed: Jul. 29, 2002

(65) Prior Publication Data

US 2003/0021321 A1 Jan. 30, 2003

(30) Foreign Application Priority Data

Jul. 30, 2001 (EP) ............................................. 01306520

(51) Int. Cl.⁷ ................................................ H01S 5/00
(52) U.S. Cl. ......................................... 372/46; 372/43
(58) Field of Search ....................... 372/43–50; 438/42, 438/40, 37; 257/10

(56) References Cited

U.S. PATENT DOCUMENTS

| | | | | |
|---|---|---|---|---|
| 4,516,243 A | * | 5/1985 | Utaka et al. .................. | 372/96 |
| 4,675,074 A | * | 6/1987 | Wada et al. ................... | 438/40 |
| 4,731,790 A | * | 3/1988 | Sawai .......................... | 372/46 |
| 4,792,959 A | | 12/1988 | Mueller et al. | |
| 4,813,050 A | * | 3/1989 | Shima et al. .................. | 372/45 |
| 4,924,476 A | * | 5/1990 | Behfar-Rad et al. .......... | 372/94 |
| 5,313,484 A | * | 5/1994 | Arimoto ....................... | 372/46 |
| 5,321,716 A | * | 6/1994 | Kinoshita et al. ............. | 372/96 |
| 5,570,385 A | * | 10/1996 | Ahn et al. ..................... | 372/43 |
| 5,574,289 A | * | 11/1996 | Aoki et al. .................... | 257/17 |
| 5,665,985 A | * | 9/1997 | Iwata .......................... | 257/95 |
| 5,825,047 A | | 10/1998 | Ajisawa et al. | |
| 5,972,730 A | * | 10/1999 | Saito et al. .................... | 438/39 |
| 6,052,397 A | * | 4/2000 | Jeon et al. ..................... | 372/46 |
| 6,058,125 A | * | 5/2000 | Thompson .................... | 372/50 |
| 6,134,368 A | * | 10/2000 | Sakata ......................... | 385/131 |
| 6,205,163 B1 | * | 3/2001 | Hamamoto ................... | 372/43 |
| 6,337,223 B1 | * | 1/2002 | Kim et al. .................... | 438/42 |
| 6,358,316 B1 | * | 3/2002 | Kizuki et al. ................ | 117/105 |
| 6,469,313 B2 | * | 10/2002 | Kim et al. ..................... | 257/10 |
| 6,541,297 B2 | * | 4/2003 | Takahashi ..................... | 438/31 |
| 2001/0036681 A1 | * | 11/2001 | Iwai et al. ..................... | 438/31 |
| 2002/0018503 A1 | * | 2/2002 | Nakamura .................... | 372/50 |

OTHER PUBLICATIONS

Electronic Letters, Iee Stevenge, GB, vol. 24 No. 2, Jan. 21, 1988, pp. 117–119, XP000120562, ISSN: 0013–5194.

Tauber D A et al: "Inherent Bandwidth Limits In Semiconductor Lasers Due To Distributed Microwave Effects" Applied Physics Letters, American Insititute Of Physics. New York, US, vol. 64, No. 13, Mar. 28, 1994, pp. 1610–1612, XP000441249, ISSN: 0003–6951.

Patent Abstracts of Japan Application No. JP 03 206678 A, Dec. 5, 1991.

Patent Abstract of Japan Application No. JP 02 164089 A, Jun. 25, 1990.

* cited by examiner

*Primary Examiner*—Don Wong
*Assistant Examiner*—Hung Tran Vy

(57) ABSTRACT

A semiconductor laser structure includes a substrate and an active region having at least one active laser layer. The active region is included in a ridge protruding from an exposed surface of the substrate. The ridge extends in the direction of the laser cavity and includes at least two opposed and electrically connected lateral extensions defining respective metal bonding pads distributed along the length of the laser cavity.

19 Claims, 2 Drawing Sheets

SEMICONDUCTOR LASER STRUCTURE AND METHOD OF MANUFACTURING SAME

FIELD OF INVENTION

The present invention refers to semiconductor lasers and, more specifically, to semiconductor laser structures including a substrate and an active laser layer, and to a method of making same.

BACKGROUND ART

Exemplary of a prior art semiconductor laser including a substrate and an active laser layer, is the arrangement shown in FIG. 1, which is currently referred to as a Semi-Insulating Buried Heterojunction (SIBH) structure.

Specifically, FIG. 1 is a cross section view including the mesa definition of an SIBH laser, including an n-type substrate 1 defining a mesa like structure laterally confined by an Fe—InP semi-insulating layer 2. Multiple quantum well (MQW) active (i.e. lasing) layers 3 are covered by p layer 4, in turn covered by $SiO_2$ mask 5. Finally, an n-InP layer 6 is superposed onto the Fe—InP semi-insulating layers 2 and adjoins the sides of mask 5 as an anti-diffusion layer to prevent Zn—Fe interdiffusion.

The structure described in the foregoing is conventional in the art and may be resorted to for manufacturing, i.e., SIBH-DFB (Distributed Feed Back) lasers operating e.g. in the 1.3 micrometer wavelength range.

High speed systems such as 10 Gbit/s Ethernet systems require uncooled laser sources capable of high temperature operation (above 80–90° C.) as well as fast direct modulation behaviour. To achieve this, laser structures with low leakage currents together with low parasitics are strongly required.

Recently, devices with operating ranges extending above 100° C. have been demonstrated by using multi-junction blocking layers.

The main disadvantage of these structures is related to their intrinsic high parasitic capacitance (hundreds of picofarads).

To reduce parasitic capacitance, fairly complicated structures including dielectric layers together with reduced contact area and narrow trenches (few microns away from the active stripe) are practically mandatory. Nevertheless, the minimum capacitance which may be achieved by resorting to these structures is in the range of 3 to 5 pF, which is still too high for the usual driver requirements.

Semi-insulating blocking layers (usually InP:Fe) are another possible solution, leading to a notable reduction of parasitics (capacitance values smaller than 1 pF have been demonstrated) and leakage currents at room temperature. A disadvantage of these prior art structures is leakage currents at high temperatures, due to the significant reduction in resistivity of the material with temperature; this may be about two orders of magnitude between 20 and 100° C.

Also, from U.S. Pat. No. 5,825,047 an optical semiconductor device is known comprising a stripe-mesa structure provided on a semi-insulating substrate. The stripe-mesa structure comprises an undoped light absorption layer sandwiched by cladding layers and by burying layers on both sides. This structure aims at reducing device capacitance to provide wide bandwidth and ultra-high operation properties.

The need therefore exists for laser structures which are not unduly complicated and still offer the possibility of reducing both the leakage current and the parasitic capacitance, together with enhanced flexibility from the electrical point of view (e.g. number of bonding pads, directional bonding, uniform high speed injection over the active stripe).

An object of the present invention is to satisfy such a need.

SUMMARY OF THE INVENTION

According to one aspect of the present invention, such an object is achieved with a laser structure having an active region with at least one active layer, wherein the active region is in a ridge protruding from an exposed surface of a substrate carrying the region.

Another aspect of the invention relates to making such a laser structure by growing plural layers forming the active region including the at least one active layer over the substrate, and selectively removing at least part of the layers grown on the substrate to produce an exposed face and a ridge that protrudes from the exposed surface of said substrate, whereby said active region is included in the ridge.

As a result of the invention, leakage current is reduced by etching the laser structure to form the ridge that closely surrounds (about 10 micrometers away) the active region, thus reducing currents flowing in a lateral confinement layer. These currents are caused by recombination of carriers in the Fe-doped layer and by defects intrinsic to the technological process.

The reduced lateral area of the device thus obtained also leads to a reduction of parasitic capacitance, typically from 6 pF to less than 2 pF (as required by a typical IC driver), while providing bonding pads large enough for accommodating two 50 micrometers tape or wire bonding arrangements.

In the presently preferred embodiment of the invention, two bonding pads are longitudinally distributed or staggered along the ridge formation i.e. the active region or cavity of the laser device. Consequently, the laser structure is suitable for very high speed applications (in the 40 Gbit/s range), where modulation transit time plays a significant role.

Also, in the presently preferred embodiment of the invention, two possibilities are offered for wire bonding directions, resulting in maximum flexibility in module design. This aspect is significant for high speed applications, where the IC driver and the laser should be designed jointly to minimise parasitic inductance and capacitance in order to permit microwave operation of the module.

BRIEF DESCRIPTION OF THE DRAWING

The invention will now be described, by way of example only, with reference to the annexed drawings, where.

DETAILED DESCRIPTION OF THE DRAWING

Figure 1:
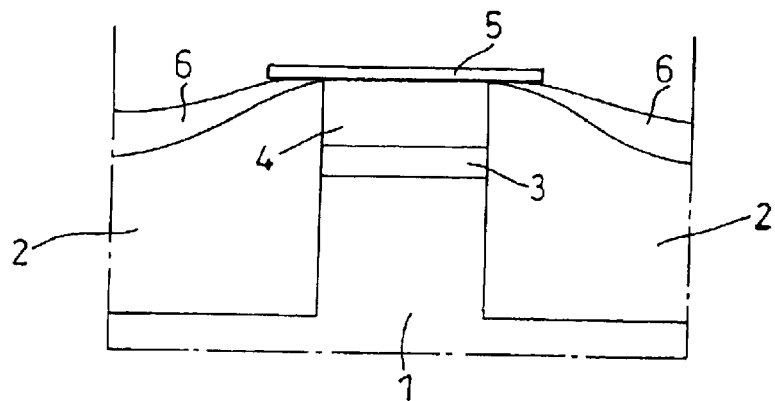
FIG. 1, related to the prior art, has been already described in the foregoing.

In FIGS. 2 to 6 parts and components of a SIBH-DFB semiconductor laser structure which are identical or functionally equivalent to those already described in connection with FIG. 1 are designated by the same reference numerals appearing in FIG. 1.

Figure 2:
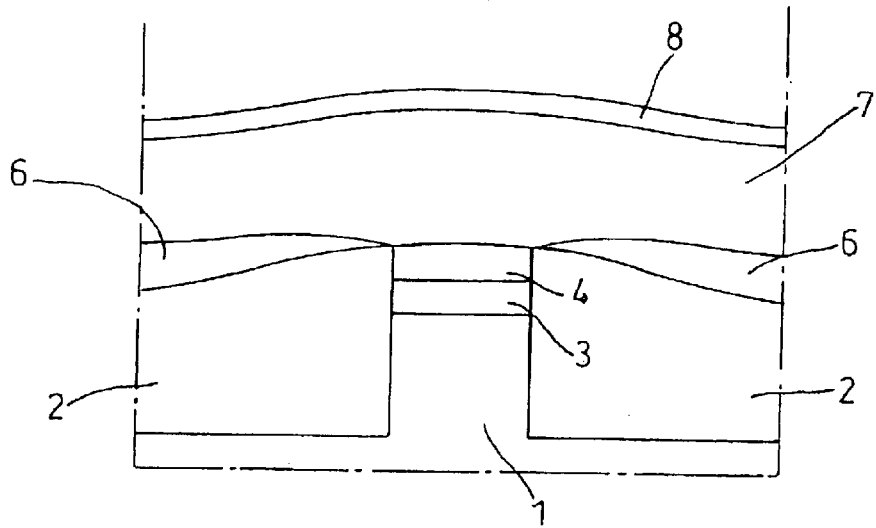
FIGS. 2 to 6 are schematic drawings of subsequent steps in the manufacturing process of a semiconductor laser structure according to a preferred embodiment of the invention.
Figure 3:
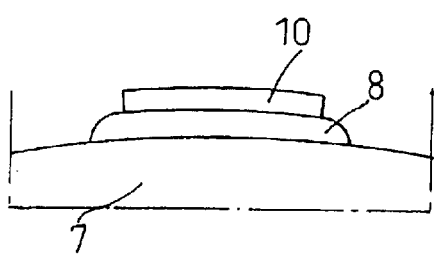
Figure 4:
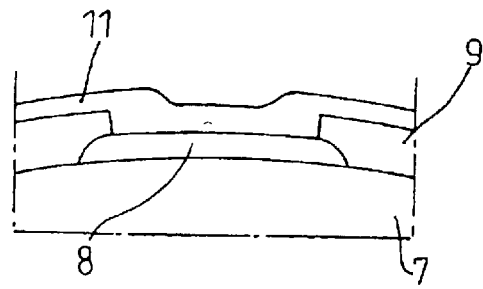

Specifically, FIGS. 2 to 4 are drawings of some standard regrowth steps which are typical of processes for manufacturing SIBH structures according to the general prior art arrangement shown in FIG. 1.

Specifically, in FIG. 2 a p layer 7 and an InGaAs layer 8 have been grown over layers 4 and 6.

A contact window in the InGaAs layer is defined as shown in FIG. 3 by using a photoresist 10 as a mask. After removing the mask, a $SiO_2$ layer 9 is deposited by plasma enhanced chemical vapour deposition (PECVD), a contact window is opened and a Ti—Au metallization layer 11 is evaporated on the upper faces of layers 8 and 9 with a thickness compatible with a following etching step (see FIG. 4).

Figure 5:
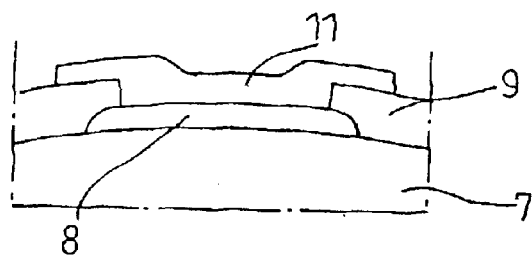

The p metal pattern is defined by conventional photolithography using a positive photoresist. The metals can be finally defined as shown in FIG. 5 by selective wet chemical etching, using the photoresist mentioned above as a mask.

Figure 6:
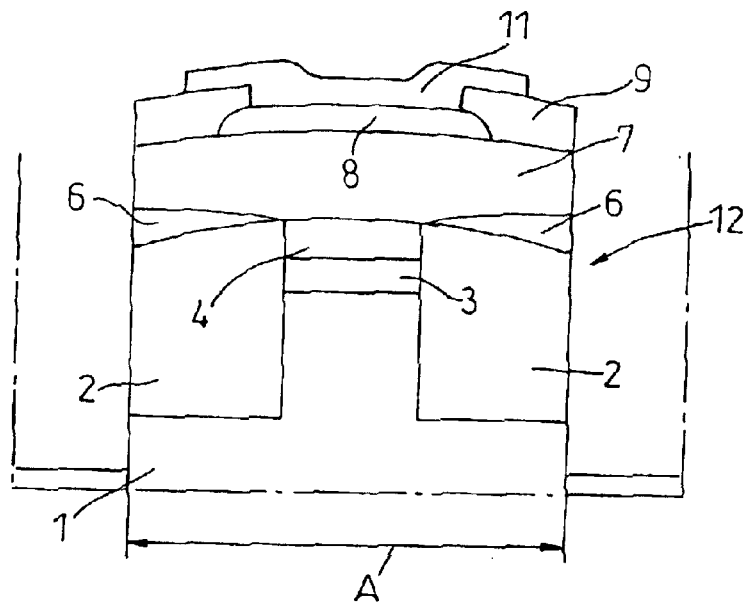

Finally, as shown in FIG. 6, ridge 12 is formed by etching the structure including layers 2–4, 6–9 and 11 down to the substrate 1 by using e.g. standard Reactive Ion Etching or wet chemical etching. After the photoresist 10 is removed, final passivation and contact window opening steps are then performed in a conventional manner.

The final result thus obtained essentially leads to the active MQW layers of the laser structure being included in a ridge formation 12 protruding from a front, exposed (upper) surface 1a of substrate 1.

The structure thus obtained is essentially parallel to the standard mesa structure of an SIBH laser, having been included in an outer mesa structure, thus leading to a sort of a general "mesa-in-the-mesa" structure.

Typical values of the "width" (designated A in FIG. 6) of ridge formation 12 are in the range of 10 to 15 micrometers while the homologous dimension (designated B in FIG. 7) of the laser chip i.e. the substrate 1, is in the range of 200 micrometers. The overall length of the laser chip (designated C in FIG. 7) substantially corresponds to the length of the laser cavity and is thus in the range of 300 micrometers.

In the arrangement shown, all the parasitic and current leakage phenomena related to the lateral confinement layers of the basic mesa structure of the laser device are drastically reduced as these layers are practically eliminated.

Preferably, ridge structure 12 is shaped in plan view so metallization layer 11 forms metal bonding area 13 including at least one and preferably two bonding pads 14 and 15. A portion of metal bonding area 13, referred to as link 16, extends sidewise of ridge structure 12 to join pads 14 and 15. Area 13 is preferably arranged to have a general "double-L" configuration as illustrated, but can also have an "S-shape" or "asymmetrical-butterfly" shape. Opposed bonding areas, such as pads 14 and 15, are distributed or staggered along the top of the laser structure, but do not contact semi-insulating layer 2 or substrate 1.

The presence of two bonding areas, such as pads 14 and 15, distributed along the active laser stripe is beneficial in reducing modulation transit time. The structure of FIG. 7 is thus particularly suitable for very high speed applications (e.g. in the 40 Gbit/s range).

Figure 7:
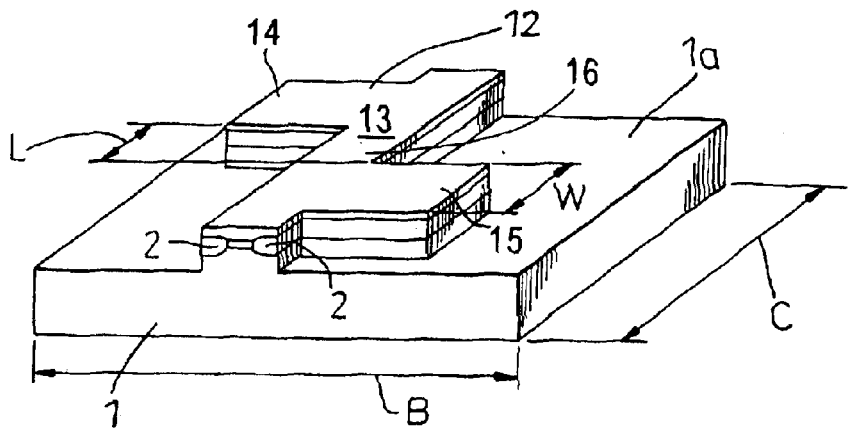
FIG. 7 is a perspective view of a low parasitic capacitance laser structure according to a preferred embodiment of the invention.

The asymmetric pad configuration shown in FIG. 7 with bonding pads 14 and 15 located at opposite sides of the laser active stripe 3 is advantageous in that it allows two wire bonding towards the IC driver from both left and/or back sides of the laser. In use, a high frequency signal source, e.g., in the 40 Gbit/s range, is connected to the two wire bonds connected to pads 14 and 15.

The preferred embodiment shown in the drawings provides an excellent compromise in terms of the number of pads and the need to keep parasitic capacitance as low as possible depending on the IC characteristics.

The length of link 16 (designated L in FIG. 7) between the adjacent, facing edges of pads 14 and 15 in the direction of the laser cavity can be set to a very low value (virtually to zero) in order to reduce the overall length C of the laser structure.

The dimension L can however be optimised according to the laser cavity length. To optimize the microwave paths, the dimension L is preferably selected as L=C/2–W, where W denotes the lateral dimension (i.e. the length) of each of pads 14 and 15 (see FIG. 7). For a laser cavity in the 300 micrometer range and square pads 14 and 15, each with sides of about 80 micrometers, a preferred value of the distance L is about 70 micrometers which allows a uniform distribution of the microwave field.

What is claimed is:

1. A semiconductor laser structure comprising a substrate having an exposed surface and an active region having at least one active laser layer, said active region being included in a ridge protruding from said exposed surface of said substrate, said active region protruding from said exposed surface of said substrate, said ridge including a link and first and second lateral extensions, the link connecting said first and second lateral extensions, said ridge being asymmetrical with respect to the link, wherein the asymmetry is in planes parallel to the substrate, each of said extensions having an electrically conducting layer above the active laser layer.

2. The semiconductor laser of claim 1 wherein said first and second lateral extensions are arranged at a given distance along the length of said active region and are electrically connected by a metal link.

3. The semiconductor laser of claim 2, wherein said distance is related to the length of said active region.

4. The semiconductor laser of claim 3, wherein said distance is substantially equal to C/2-W, where C is the length of said active region and W is the lateral dimension of said extensions.

5. The semiconductor laser of claim 4, wherein said at least two lateral extensions ire arranged at opposite sides of said active region.

6. The semiconductor laser of claim 1, wherein said at least two lateral extensions are arranged at opposite sides of said active region.

7. A process of manufacturing the semiconductor laser structure of claim 1, comprising the steps of:

growing a plurality of layers defining the active region comprising the at least one active laser layer over the substrate, and selectively removing at least part of the layers grown on said substrate to produce the exposed surface of said substrate as well as the ridge including said active region, whereby said active region is included in the ridge protruding from the exposed surface of said substrate.

8. The laser structure of claim 1 wherein the electrically conducting layer of each of said extensions comprises a metal bonding pad.

9. The laser structure of claim 8 wherein the link is part of the electrically conducting layer above the active laser layer and electrically connects the metal bonding pads of said extensions to each other.

10. The laser structure of claim 1 wherein the link is part of the electrically conducting layer above the active laser layer and electrically connects the electrically conducting layers of said extensions to each other.

11. The laser structure of claim 10 wherein the link extends longitudinally between said extensions and said first and second extensions respectively extend in opposite first and second directions from the link.

12. The laser structure of claim 11 wherein the ridge is constructed so that there is no extension from the link aligned with the first extension that extends in the second direction and there is no extension from the link aligned with the second extension that extends in the first direction.

13. The laser structure of claim 12 wherein said first and second extensions extend transversely of the link and have substantially parallel longitudinal axes at substantially right angles to the longitudinally extending direction of the link.

14. The laser structure of claim 13 wherein the link has a length between the first and second extensions of approximately 70 micrometers, the ridge has a length in a direction substantially parallel to the longitudinal extent of the link of approximately 300 micrometers and a length in a direction substantially transverse to the longitudinal extent of the link of approximately 200 micrometers, and each of said extensions has approximately a square configuration with sides of about 80 micrometers.

15. The laser structure of claim 12 wherein the link has a length L between the first and second extensions and each of said extensions has approximately a square configuration with sides having a length W and said ridge has a length C in the longitudinal direction of extent of the link, where $L = C/2 - W$.

16. The laser structure of claim 10 wherein the ridge has a double-L, or S-shape, or asymmetrical-butterfly configuration in planes parallel to the substrate.

17. The laser structure of claim 1 wherein the link has a length L between the first and second extensions and each of said extensions has approximately a square configuration with sides having a length W and said ridge has a length C in the longitudinal direction of extent of the link, where $L = C/2 - W$.

18. The laser structure of claim 1 wherein the ridge has a double-L, or S-shape, or asymmetrical-butterfly configuration in planes parallel to the substrate.

19. The laser structure of claim 1 wherein said lateral extensions are located in proximity to opposite edges of said ridge.

* * * * *